United States Patent
Ushio et al.

(10) Patent No.: US 10,734,868 B2
(45) Date of Patent: Aug. 4, 2020

(54) VEHICLE ELECTRONIC CONTROL DEVICE AND MOTOR DRIVE DEVICE

(71) Applicant: Mitsubishi Electric Corporation, Tokyo (JP)

(72) Inventors: Kohei Ushio, Tokyo (JP); Yoshihito Asao, Tokyo (JP); Akihiko Mori, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 848 days.

(21) Appl. No.: 15/324,007

(22) PCT Filed: Sep. 24, 2014

(86) PCT No.: PCT/JP2014/075181
§ 371 (c)(1),
(2) Date: Jan. 5, 2017

(87) PCT Pub. No.: WO2016/046898
PCT Pub. Date: Mar. 31, 2016

(65) Prior Publication Data
US 2017/0207685 A1 Jul. 20, 2017

(51) Int. Cl.
*H02K 11/00* (2016.01)
*H01R 13/405* (2006.01)
(Continued)

(52) U.S. Cl.
CPC .......... *H02K 11/0094* (2013.01); *B60R 16/03* (2013.01); *H01R 13/405* (2013.01);
(Continued)

(58) Field of Classification Search
None
See application file for complete search history.

(56) References Cited

U.S. PATENT DOCUMENTS 10,418,885 B2 * 9/2019 Hayashi ................... H02K 5/10
2002/0053205 A1 5/2002 Geiger et al.
(Continued)

FOREIGN PATENT DOCUMENTS

JP 2002213405 A 7/2002
JP 2006-287065 A 10/2006
(Continued)

OTHER PUBLICATIONS

Communication dated Apr. 24, 2018, from the European Patent Office in counterpart European Application No. 14902408.5.
(Continued)

*Primary Examiner* — Oscar C Jimenez
(74) *Attorney, Agent, or Firm* — Sughrue Mion, PLLC; Richard C. Turner

(57) ABSTRACT

In this vehicle electronic control device, a control board having an electronic component mounted thereon is housed inside a case and a connector portion for connecting the control board to the outside is formed integrally with the case. The connector portion is formed by a housing portion covering the control board, and a terminal portion integrally embedded in the housing portion. The terminal portion has: a terminal for external connection, protruding from the housing portion; and an intermediate path portion extending from the terminal and connected to the control board. An exposure portion which allows the intermediate path portion to be exposed over the entire periphery thereof is formed in a part of the housing portion. An interface sealing member for sealing the interface between the housing portion and the intermediate path portion is provided in the exposure portion.

16 Claims, 5 Drawing Sheets

(51) Int. Cl.
    *H01R 13/52*     (2006.01)
    *H02K 5/22*     (2006.01)
    *B60R 16/03*     (2006.01)
    *H05K 5/00*     (2006.01)
    *H05K 5/02*     (2006.01)
    *H05K 5/06*     (2006.01)
    *H02K 11/33*     (2016.01)

(52) U.S. Cl.
    CPC ......... *H01R 13/52* (2013.01); *H01R 13/5219* (2013.01); *H02K 5/225* (2013.01); *H05K 5/0017* (2013.01); *H05K 5/0247* (2013.01); *H05K 5/064* (2013.01); *H02K 11/33* (2016.01)

(56) References Cited

U.S. PATENT DOCUMENTS

| | | |
|---|---|---|
| 2003/0121261 A1 | 7/2003 | Geiger |
| 2004/0177612 A1 | 9/2004 | Geiger |
| 2005/0208839 A1* | 9/2005 | Mott ................ B29C 45/14311 439/722 |
| 2007/0072452 A1 | 3/2007 | Inagaki et al. |
| 2007/0155200 A1 | 7/2007 | Shinohira et al. |
| 2007/0178723 A1 | 8/2007 | Kataoka et al. |
| 2009/0243407 A1* | 10/2009 | Kato ................ H02K 11/048 310/62 |
| 2010/0007228 A1 | 1/2010 | Hatano et al. |
| 2010/0052481 A1* | 3/2010 | Oohashi ................ H02K 5/141 310/68 D |
| 2013/0044420 A1* | 2/2013 | Iwamoto ............ H01R 13/447 361/679.01 |
| 2014/0354087 A1* | 12/2014 | Kato .................... H02K 11/046 310/43 |
| 2014/0361648 A1 | 12/2014 | Shirakata et al. |
| 2015/0245468 A1* | 8/2015 | Barry ..................... A61N 1/08 174/257 |
| 2017/0334375 A1* | 11/2017 | Shigyo ................ H01R 13/518 |
| 2018/0048218 A1* | 2/2018 | Im .......................... H02K 5/225 |
| 2019/0016373 A1* | 1/2019 | Urimoto ............. B62D 5/0406 |

FOREIGN PATENT DOCUMENTS

| | | |
|---|---|---|
| JP | 2009112063 A | 5/2009 |
| JP | 2010-225452 A | 10/2010 |
| JP | 4929659 B2 | 5/2012 |
| WO | 2013157065 A1 | 10/2013 |

OTHER PUBLICATIONS

Communication dated Jul. 2, 2018, from the State Intellectual Property Office of People's Republic of China in counterpart Application No. 201480081754.2.

International Search Report of PCT/JP2014/075181 dated Dec. 9, 2014 [PCT/ISA/210].

Communication dated Jun. 6, 2017 from the Japanese Patent Office in counterpart Japanese application No. 2016-549690.

Communication dated Jun. 29, 2019, issued by the Intellectual Property India in application No. 201747008085.

Communication dated Feb. 7, 2020, from the European Patent Office in European Application No. 14902408.5.

\* cited by examiner

VEHICLE ELECTRONIC CONTROL DEVICE AND MOTOR DRIVE DEVICE

CROSS REFERENCE TO RELATED APPLICATIONS

This application is a National Stage of International Application No. PCT/JP2014/075181, filed Sep. 24, 2014, the contents of which are incorporated herein by reference in its entirety.

TECHNICAL FIELD

The present invention relates to a vehicle electronic control device and a motor drive device, and in particular, to a waterproof structure around a connector for transferring power, a signal, and the like for these devices.

BACKGROUND ART

Some of conventional waterproof structures around a connector of a vehicle electronic control device use a waterproof connector to address waterproofness.

However, even in the case of using a waterproof connector, it is necessary to also consider that a very small gap arises between a housing and a terminal provided in the housing, and then, due to temperature change by heat generation and cooling of an electronic device, water drop is absorbed.

In particular, if water drop enters the electronic control device, short-circuit occurs because of small-sized components. As a result, the electronic control device does not function, and further, travelling of the vehicle might be influenced. Accordingly, reliably ensuring waterproofness is an important matter.

Therefore, for example, as in an electronic control device disclosed in Patent Document 1, a storage portion in which a sealing agent can be stored is formed on the inner wall side of a penetration wall through which a terminal penetrates, and the sealing agent is applied from the inside of a housing in which the electronic control device is provided.

CITATION LIST

Patent Document

Patent Document 1: Japanese Patent No. 4929659

SUMMARY OF THE INVENTION

Problems to be Solved by the Invention

In the conventional structure disclosed in Patent Document 1, since the sealing agent is applied from the inside of the housing in which the electronic control device is provided, it is necessary to provide the storage portion protruding on the inner surface side of the penetration wall through which the terminal penetrates.

Currently, the electronic control device body is downsized, and also the housing itself is increasingly reduced. Depending on the position at which the storage portion is provided and the size of the storage portion, size reduction and cost reduction of the device are influenced.

In waterproof perspective, water might intrude unless the interface between the terminal and the entire peripheral surface around the terminal is sealed, and further, the interface between resin members composing the housing is also a target for a waterproof structure. Therefore, it is necessary to seal all these parts.

The present invention has been made to solve the above problem, and an object of the present invention is to provide a vehicle electronic control device and a motor drive device that enable further simplification of the waterproof structure around a connector and enable cost reduction and size reduction.

Solution to the Problems

A vehicle electronic control device according to the present invention is a vehicle electronic control device in which a control board having an electronic component mounted thereon is housed inside a case and a connector portion for connecting the control board to outside is formed integrally with the case. The connector portion is formed by a housing portion covering the control board, and a terminal portion integrally embedded in the housing portion. The terminal portion has: a terminal for external connection, protruding from the housing portion; and an intermediate path portion extending from the terminal and connected to the control board. An exposure portion which allows the intermediate path portion to be exposed over an entire periphery thereof is formed in a part of the housing portion. An interface sealing member for sealing an interface between the housing portion and the intermediate path portion is provided in the exposure portion.

Effect of the Invention

The present invention can achieve a vehicle electronic control device and a motor drive device that have an enhanced waterproof function around a connector and have a further simplified waterproof structure, thereby achieving cost reduction and size reduction.

DESCRIPTION OF EMBODIMENTS

Embodiment 1

Figure 1:
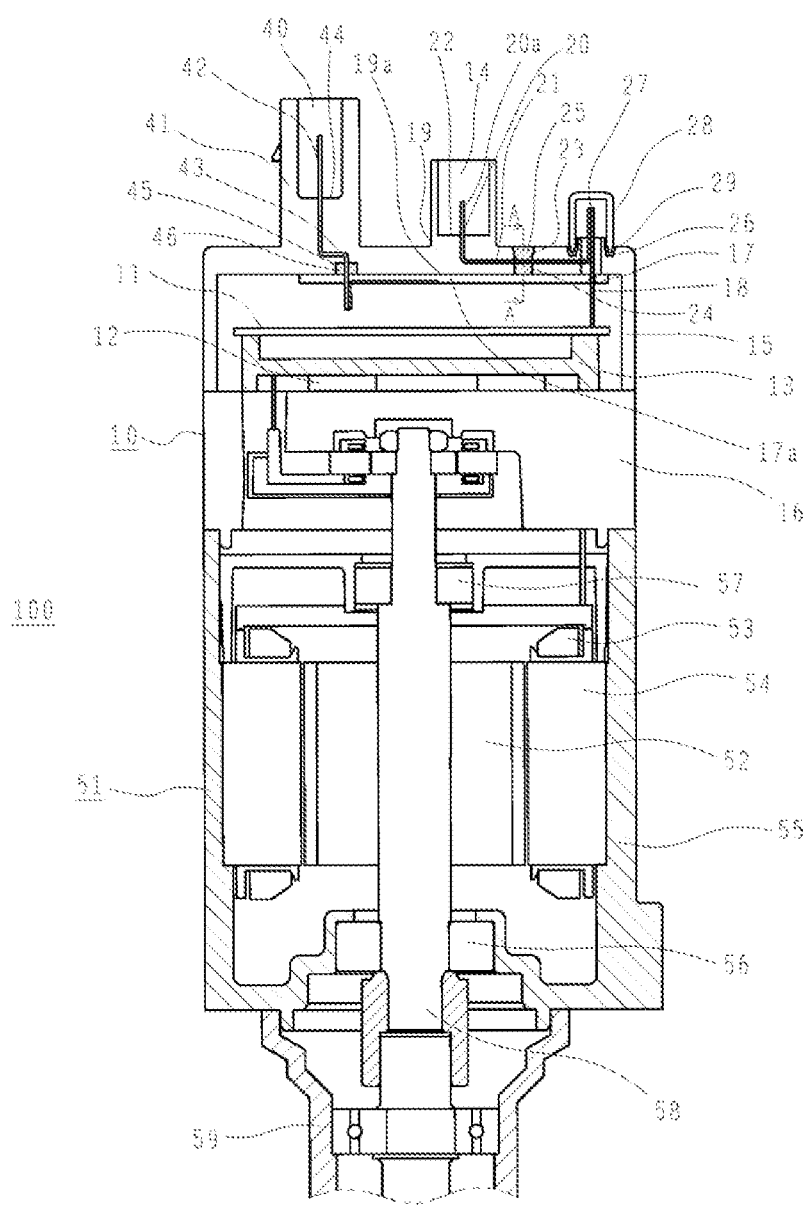
FIG. 1 is a sectional configuration diagram showing a motor drive device having a vehicle electronic control device according to embodiment 1 of the present invention.
Figure 2:
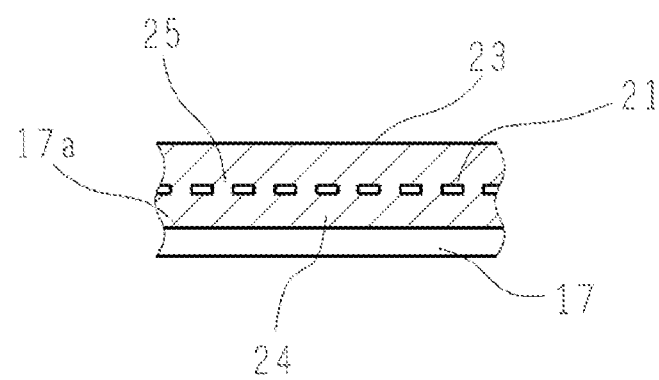
FIG. 2 is an A-A sectional view in FIG. 1.

Hereinafter, embodiment 1 of the present invention will be described with reference to the drawings. FIG. 1 and FIG. 2 are a sectional configuration diagram and an A-A sectional view showing a motor drive device having a vehicle electronic control device according to embodiment 1 of the present invention.

In FIG. 1 and FIG. 2, the motor drive device 100 is composed of an electric motor 51 and a vehicle electronic control device 10 which is integrally attached to an end in the axial direction of the electric motor 51 and which performs power feeding to the electric motor 51 and drive control for the electric motor 51.

The electric motor 51 is a three-phase brushless motor, and includes: a rotor 52; a stator 54 having armature windings 53 for U phase, V phase, and W phase; a motor frame 55 covering the outer circumference of the stator 54; an output-side bearing 56 coaxially fixed to the motor frame 55 and rotatably supporting the rotor 52; an anti-output side bearing 57; and an output shaft 58.

The vehicle electronic control device 10 includes: a control board 11; a power portion 12 for driving the electric motor 51; a frame 13 in which a plurality of electrically conductive plates are insert-molded; a signal connector 14 to which a torque sensor and a vehicle signal are connected; a power supply connector 40 connected to a power supply portion; a case 15 integrated with the signal connector 14 and the power supply connector 40 and surrounding the control board 11; a metallic heatsink 16 having contact with the power portion 12 and having a high thermal conductivity; and a case frame 17 to which a coil of a noise filter is mounted and in which a plurality of electrically conductive plates are insert-molded.

The signal connector 14 formed on the case 15 is formed by: a housing portion 19 which forms a part of the case 15, is made of a resin member, and surrounds the control board 11; and a terminal portion 20 made of a metal conductor and formed integrally with the housing portion 19.

The terminal portion 20 has: a terminal 20a for external connection, protruding from the housing portion 19; and an intermediate path portion 21 extending from the terminal 20a and connected to the control board 11. In a part of the housing portion 19, an exposure portion 23 is formed which allows the intermediate path portion 21 to be exposed over the entire periphery thereof.

An upper surface 17a of the case frame 17 and an inner surface 19a of the housing portion 19 are fixed in close contact with each other. A groove portion 24 with a bottom is formed by the exposure portion 23 and the upper surface 17a of the case frame. The groove portion 24 is filled with an interface sealing member 25 for sealing the housing portion 19 and the intermediate path portion 21 in a liquid-tight manner.

The intermediate path portion 21 of the terminal portion 20 extends to the position of the end of a terminal 18 extending from the frame 13 toward the seat face portion 22 side of the signal connector 14, and is joined at a joining portion 27 outside the housing portion 19. Thus, the intermediate path portion 21 is connected to the control board 11 via the terminal 18.

Further, a depressed portion 26 is formed in the outer surface of the housing portion 19, around the joining portion 27. The joining portion 27 is covered with a cover 28 fitted to the depressed portion 26. The depressed portion 26 is filled with an interface sealing member 29, whereby the cover 28 is sealed and fixed with the depressed portion 26 in a liquid-tight manner.

The power supply connector 40 is composed of a housing portion 41 and a terminal portion 42. The terminal portion 42 has an intermediate path portion 43 embedded in the housing portion 41, and a seat face portion 44 on a fitting portion bottom surface. On the intermediate path portion 43, a bottomed storage portion 45 having a depressed shape is provided on the inner surface 19a side of the housing portion 41. The intermediate path portion 43 is exposed over the entire periphery thereof at the position of the bottomed storage portion 45. The bottomed storage portion 45 is filled with an interface sealing member 46 for sealing the exposed part of the intermediate path portion 43 and the housing portion 41 in a liquid-tight manner.

In the vehicle electronic control device 10 configured as described above, an ignition switch (not shown) of the vehicle is turned on to supply power from the power supply portion to the control board 11 via the power supply connector 40, information signals from the torque sensor and a vehicle speed sensor are inputted via the signal connector 14 to a microcomputer (not shown) mounted on the control board 11, to calculate a current value corresponding to steering assist torque, the power portion 12 causes motor drive current to flow to the electric motor 51, thereby outputting a desired amount of assist torque in a desired rotational direction to the electric motor 51, and then power is transmitted from the output shaft 58 to a gear speed reducer 59.

As described above, in the present embodiment 1, in the vehicle electronic control device 10, the control board 11 having an electronic component mounted thereon is housed inside the case 15, and the connector portion 20 for connecting the control board 11 to the outside is formed integrally with the case 15. The connector portion 20 is formed by the housing portion 19 covering the control board 11, and the terminal portion 20 integrally embedded in the housing portion 19. The terminal portion 20 has; the terminal 20a for external connection, protruding from the housing portion 19; and the intermediate path portion 21 extending from the terminal 20a and connected to the control board 11. In a part of the housing portion 19, the exposure portion 23 is formed which allows the intermediate path portion 21 to be exposed over the entire periphery thereof. The interface sealing member 25 for sealing the interface between the housing portion 19 and the intermediate path portion 21 is provided in the exposure portion 23. Thus, at least for the signal connector 14, a storage portion for storing an interface sealing member need not be provided so as to protrude on the inner surface 19a side of the housing portion 19, and size reduction and cost reduction of the device can be achieved.

In addition, the intermediate path portion 21 of the terminal portion 20 extends to the position of the end of the terminal 18 extending from the frame 13 toward the seat face portion 22 side of the signal connector 14, and is joined with the joining portion 27 outside the housing portion 19, whereby the intermediate path portion 21 is connected to the control board 11 via the terminal 18. Further, the depressed portion 26 is formed in the outer surface of the housing portion 19, around the joining portion 27. The joining portion 27 is covered with the cover 28 fitted to the depressed portion 26, the depressed portion 26 is filled with the interface sealing member 29, and the cover 28 is sealed and fixed with the depressed portion 26 in a liquid-tight manner. Therefore, even if the exterior side of the case 15 is wetted and water drop is accumulated on the seat face portion 22 of the signal connector 14, and then if water enters the interface between the intermediate path portion 21 and the housing portion 19, the water is prevented from intruding to the control board 11 because the entire periphery around the joining portion 27 is filled with the interface sealing member 29.

In addition, for the power supply connector 40, the bottomed storage portion. 45 having a depressed shape is provided on the inner surface 19a side of the housing portion 41, the intermediate path portion 43 is exposed over the entire periphery thereof at the position of the bottomed storage portion 45, and the bottomed storage portion 45 is filled with the interface scaling member 46 for sealing the exposed portion of the intermediate path portion. 43 and the housing portion 41 in a liquid-tight manner. Therefore, also in the power supply connector 40, water does not intrude to the control board 11.

Embodiment 2

Figure 3:
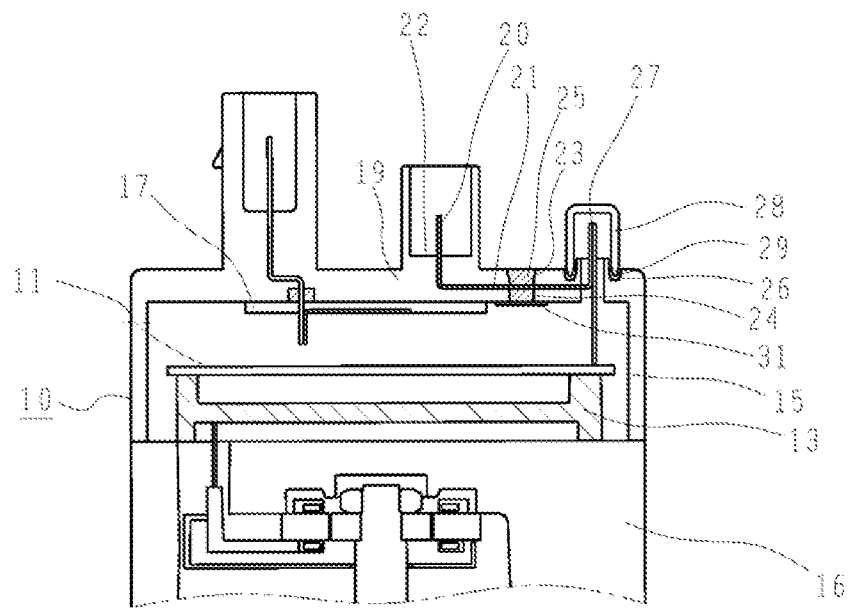
FIG. 3 is a partial sectional configuration diagram showing a motor drive device having a vehicle electronic control device according to embodiment 2 of the present invention.

FIG. 3 is a partial sectional configuration diagram showing a vehicle electronic control device according to embodiment 2 of the present invention.

In embodiment 1, as for the groove portion 24, the upper surface 17a of the case frame 17 and the inner surface 19a of the housing portion 19 are fixed in close contact with each other, and the groove portion 24 with a bottom is formed by the exposure portion 23 and the upper surface 17a of the case frame 17. On the other hand, in the present embodiment 2, instead of the case frame 17, a plate 31 is attached at the upper surface 17a of the case frame 17, thereby forming the groove portion 24 with a bottom.

As the plate 31, an adhesive tape may be used.

Even such a configuration can provide the same effect as in embodiment 1.

Embodiment 3

Figure 4:
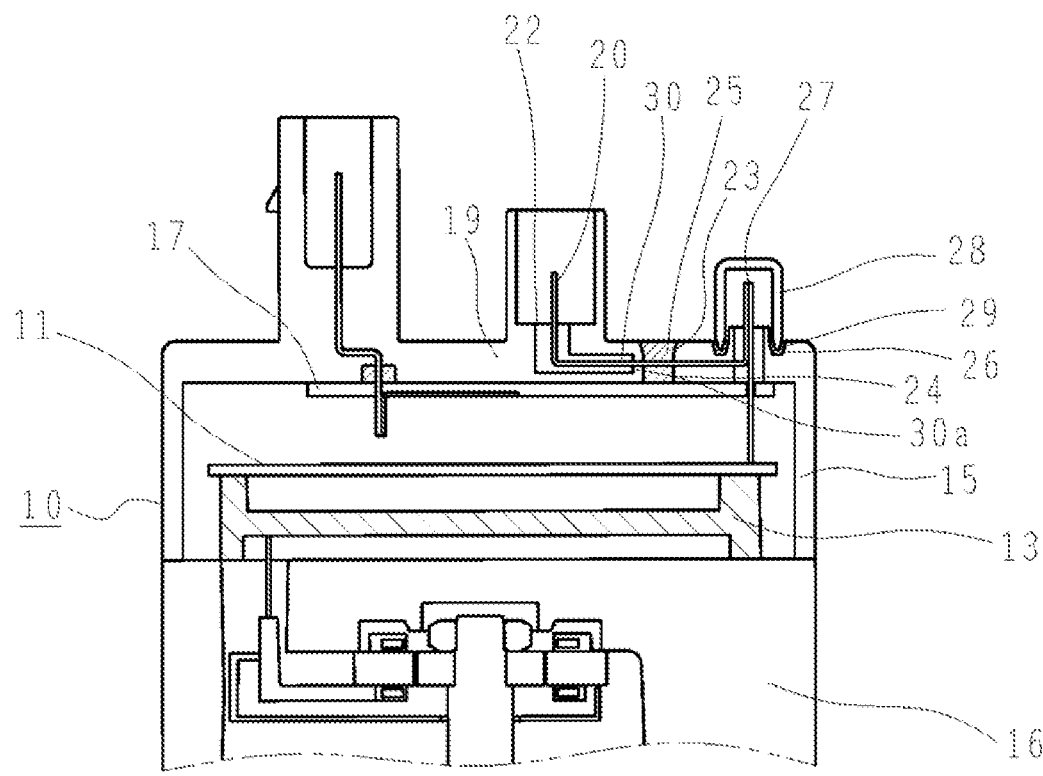
FIG. 4 is a partial sectional configuration diagram showing a motor drive device having a vehicle electronic control device according to embodiment 3 of the present invention.

FIG. 4 is a partial sectional configuration diagram showing a vehicle electronic control device according to embodiment 3 of the present invention.

In the above embodiments 1 and 2, the intermediate path portion 21 of the terminal portion 20 is a single component made of a metallic conductor. On the other hand, in the present embodiment 3, as the terminal portion 20, a pre-mold type is used. The intermediate path portion 21 at a part other than the exposure portion 23 is partially covered with a pre-mold resin 30 formed separately from the housing portion 19, and an end 30a on the exposure portion 23 side of the pre-mold resin 30 is positioned away from the exposure portion 23 toward the seat face portion 22 side.

Such a configuration allows the same effect as in the embodiments 1 and 2 to be obtained even in the case of using the terminal portion 20 of a pre-mold type.

Embodiment 4

Figure 5:
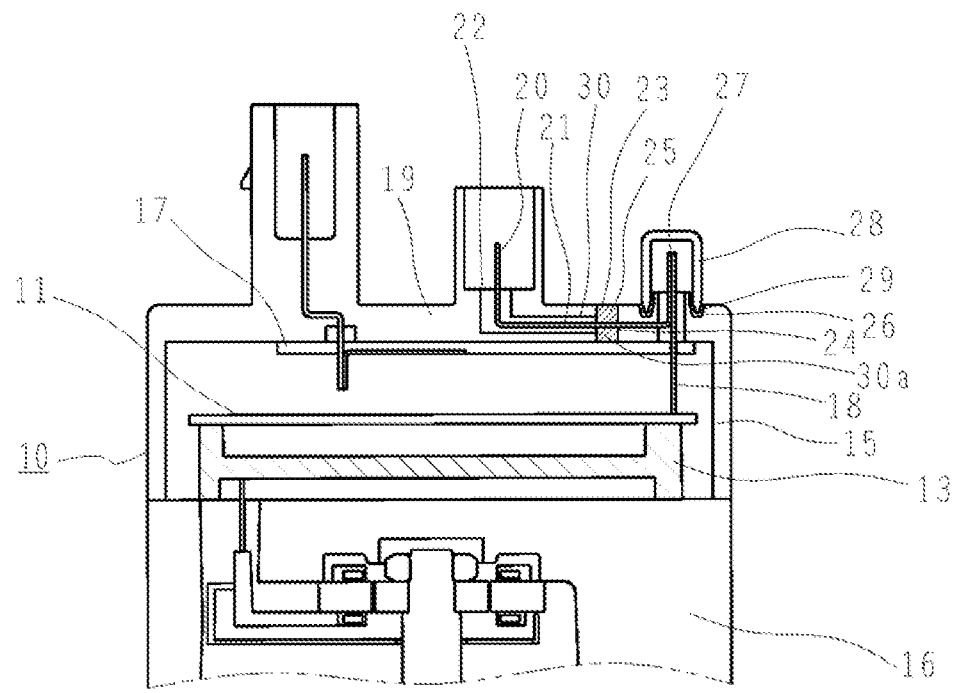
FIG. 5 is a partial sectional configuration diagram showing a motor drive device having a vehicle electronic control device according to embodiment 4 of the present invention.

FIG. 5 shows a configuration diagram showing a vehicle electronic control device according to embodiment 4 of the present invention.

As shown in FIG. 5, although in the above embodiment 3, the end 30a on the exposure portion 23 side of the pre-mold resin 30 of the terminal portion 20 is provided away from the exposure portion 23 toward the seat face portion 22 side, the end 30a of the pre-mold resin 30 is exposed to the exposure portion 23 side and forms a part of the groove portion 24.

Such a configuration can provide the same effect as in embodiments 1 to 3, and in addition, allows use of the same molding component for positioning of the end 30a of the pre-mold resin 30 and for forming the exposure portion 23, whereby the signal connector 14 can be accurately molded and the quality can be improved.

Embodiment 5

Figure 6:
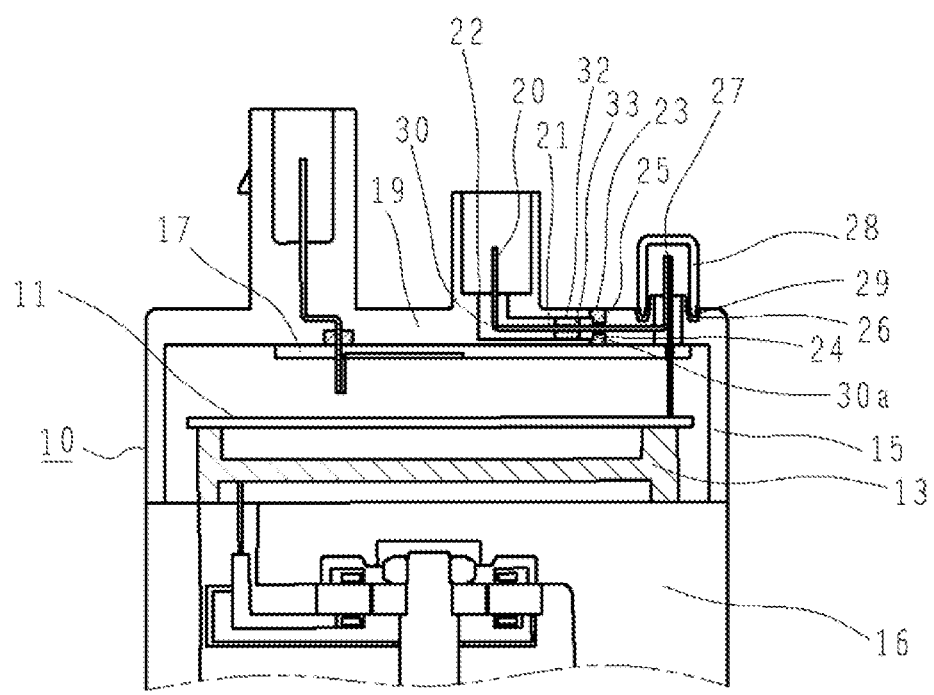
FIG. 6 is a partial sectional configuration diagram showing a motor drive device having a vehicle electronic control device according to embodiment 5 of the present invention.
Figure 7:
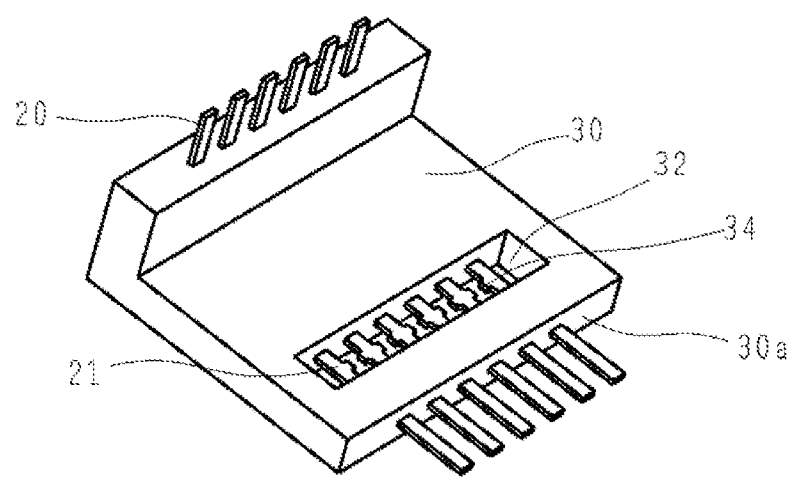
FIG. 7 is a perspective view showing a terminal portion of a pre-mold type according to embodiment 5 in the present invention.

FIG. 6 and FIG. 7 are a partial sectional configuration diagram showing a vehicle electronic control device according to embodiment 5 of the present invention, and a perspective view of the terminal portion 20 of a pre-mold type molded with pre-mold resin.

In embodiment 4, the exposure portion 23 provided, on the intermediate path portion 21 of the terminal portion 20, in a part of the housing portion 19, and the intermediate path portion 21 is exposed over the entire periphery thereof at the exposure portion 23. On the other hand, in the present embodiment 5, as shown in FIG. 6 and FIG. 7, an exposure hole 32 which allows the intermediate path portion 21 to be exposed over the entire periphery thereof is formed in an intermediate part of the pre-mold resin 30, and is placed, and the inside of the exposure hole 32 is filled with an interface sealing member 33, whereby the intermediate path portion 21 exposed over the entire periphery thereof at the exposure hole 32, and the pre-mold resin are sealed.

In addition, the end 30a of the pre-mold resin 30 is exposed at the exposure portion 23 and forms a part of the groove portion 24, the intermediate path portion 21 protruding from the pre-mold resin 30 and positioned at the exposure portion 23 is covered with the resin of the housing portion 19, and the interface sealing member 25 is provided at the interfaces among three parts of the intermediate path portion 21, the pre-mold resin 30, and the housing portion.

Such a configuration can provide the same effect as in the above embodiments 1 to 4, and allows the exposure hole 32 to be also used as a hole for cutting a tie-bar portion 34 for arranging the terminal portion 20 in parallel with the resin plane to perform insert molding, whereby the cost for processing the pre-mold can be reduced.

In addition, when the terminal portion and the housing portion are integrally molded, the exposure hole 32 can be used as a pressing position for the mold, and it is not necessary to form a terminal relief portion for mold clamping in the mold for allowing the intermediate path portion 21 to be exposed over the entire periphery thereof at the exposure portion 23, whereby the mold cost can be reduced.

Further, by the sealing for the exposure portion 23, two interfaces of the housing portion 19 and the pre-mold resin 30 are sealed with the interface sealing member 25. Therefore, the sealing interfaces are decreased, whereby sealing performance is improved.

Embodiment 6

Figure 8:
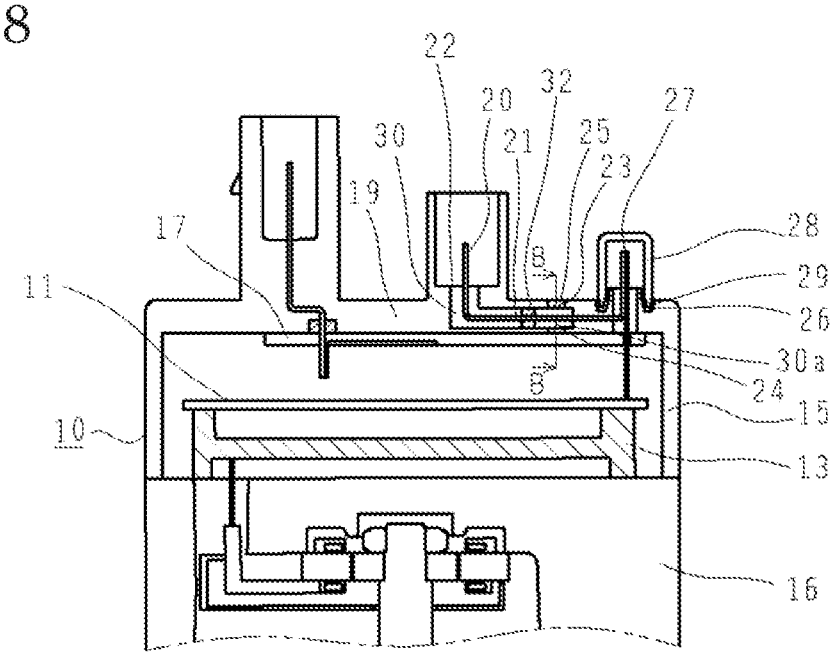
FIG. 8 is a partial sectional configuration diagram showing a motor drive device having a vehicle electronic control device according to embodiment 6 of the present invention.
Figure 9:
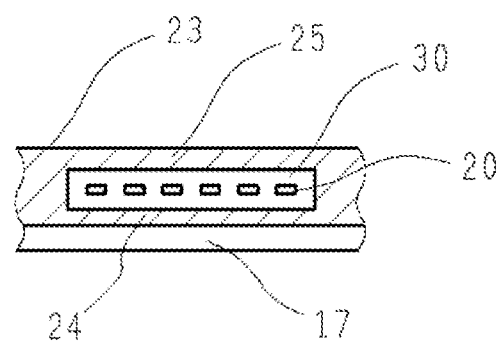
FIG. 9 is a B-B sectional view in FIG. 8.

FIG. 8 and FIG. 9 are a partial sectional configuration diagram and a B-B sectional view showing a vehicle electronic control device according to embodiment 6 of the present invention.

In the above embodiment 5, the end 30a of the pre-mold resin 30 is exposed at the exposure portion 23, and the terminal portion 20 positioned at the exposure portion 23 is covered with the resin of the housing portion 19. On the other hand, in the present embodiment 6, as shown in FIG. 8 and FIG. 9, the exposure portion 23 is formed, on the outer periphery of the pre-mold resin 30, at a position other than the exposure hole 32. At the exposure portion 23, the pre-mold resin 30 is exposed over the entire periphery thereof, and the exposure portion 23 is filled with the interface sealing member 25 in a liquid-tight manner.

Even such a configuration can provide the same effect as in embodiment 5.

Embodiment 7

Figure 10:
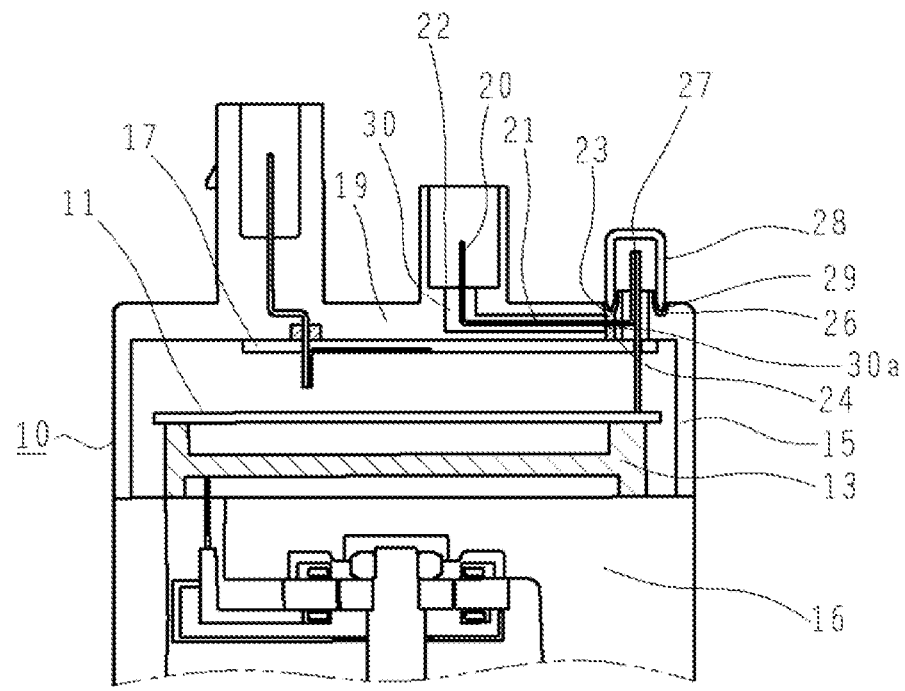
FIG. 10 is a partial sectional configuration diagram showing a motor drive device having a vehicle electronic control device according to embodiment 7 of the present invention.

FIG. 10 is a partial sectional configuration diagram showing a vehicle electronic control device according to embodiment 7 of the present invention.

In the above embodiments 1 to 6, the groove portion. 24 is formed, on the outer surface side of the housing portion 19, at a position different from the depressed portion 26 around the joining portion 27. On the other hand, in the present embodiment 7, as shown in FIG. 10, the groove portion 24 is formed as a part of the depressed portion 26.

Such a configuration can provide the same effect as in embodiments 1 to 6, and also allows the interface sealing member 29 in the depressed portion 26 to be shared with the groove portion 24, whereby the used materials can be decreased, the process time can be shortened, and the cost can be reduced.

Embodiment 8

Figure 11:
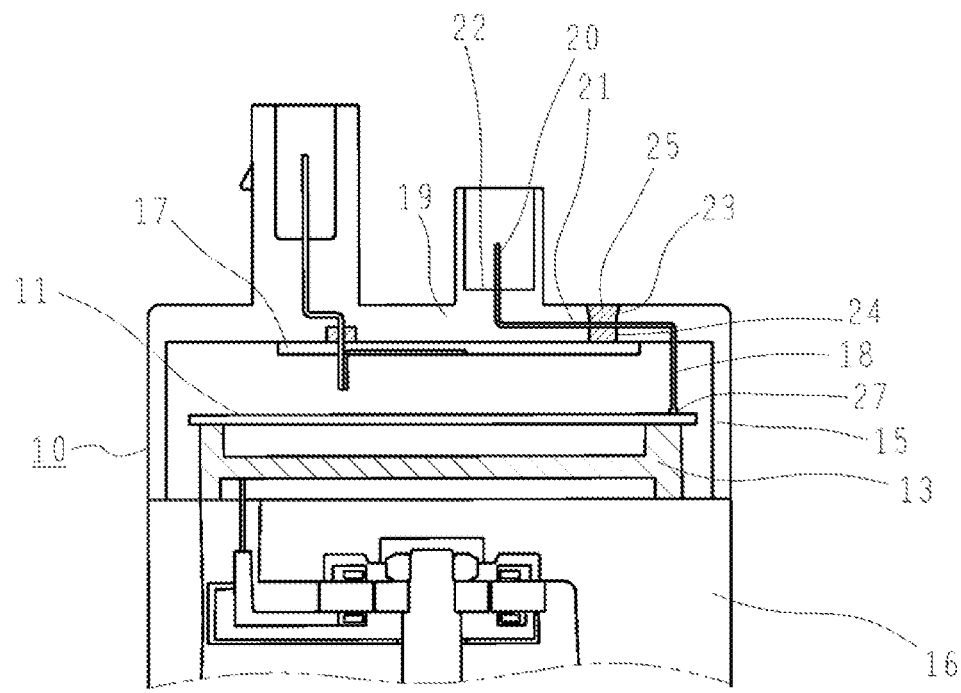
FIG. 11 is a partial sectional configuration diagram showing a motor drive device having a vehicle electronic control device according to embodiment 8 of the present invention.

FIG. 11 is a partial sectional configuration diagram showing a vehicle electronic control device according to embodiment 8 of the present invention.

In the above embodiments 1 to 7, the intermediate path portion 21 of the terminal portion 20 extends to the position of the end of the terminal 18 extending from the frame 13 toward the seat face portion 22 side of the signal connector 14, and is joined at the joining portion 27 outside the housing portion 19. On the other hand, in the present embodiment 7, as shown in FIG. 11, the intermediate path portion 21 extends toward the control board 11 side and is directly connected to the control board 11.

In such a configuration, since the joining portion 27 does not extend to the outside of the housing portion 19 as in the above embodiments 1 to 7, it is not necessary to provide the cover 28, the depressed portion 26, and the interface sealing member 29 for ensuring waterproofness. Thus, the number of components and the number of process steps can be decreased, whereby size reduction and cost reduction can be achieved.

In embodiments 1 to 8, the exposure portion 23 may be used as a hole or groove for pressing at the time of mold clamping of the terminal portion 20 and the pre-mold resin 30 when the case 15 is molded.

At least one of the interface sealing members 25 and 29 may be potting resin.

It is noted that, within the scope of the present invention, the above embodiments may be freely combined with each other, or each of the above embodiments may be modified or simplified as appropriate.

DESCRIPTION OF THE REFERENCE CHARACTERS 10 vehicle electronic control device
11 control board
12 power portion
13 frame
14 signal connector
15 case
16 heatsink
17 case frame
17a upper surface
18 terminal
19 housing portion
19a inner surface
20 terminal portion
20a terminal
21 intermediate path portion
22 seat face portion
23 exposure portion
24 groove portion
25 interface sealing member
26 depressed portion
27 joining portion
28 cover
29 interface sealing member
30 pre-mold resin
30a end
31 plate
32 exposure hole
33 interface sealing member
34 tie-bar portion
40 power supply connector
41 housing portion
42 terminal portion
43 intermediate path portion
44 seat face portion
45 bottomed storage portion.
46 interface sealing member
51 electric motor
52 rotor
53 armature winding
54 stator
55 motor frame
56, 57 bearing
58 output shaft
59 gear speed reducer
100 motor drive device

The invention claimed is:

1. A vehicle electronic control device comprising:
a control board having an electronic component mounted thereon housed inside a case; and
a connector portion for connecting the control board to an outside, wherein
the connector portion is formed integrally with the case,
the connector portion is formed by a housing portion covering the control board, and a terminal portion integrally embedded in the housing portion,
the terminal portion includes a terminal for external connection, protruding from the housing portion, and an intermediate path portion extending from the terminal portion and connecting to the control board,
an exposure portion which allows the intermediate path portion to be exposed over an entire periphery thereof is formed in a part of the housing portion,
the exposure portion including a cover that protrudes beyond an outer surface of the housing portion in a same direction as the terminal for external connection extends, and
an interface sealing member for sealing an interface between the housing portion and the intermediate path portion is provided in the exposure portion.

2. The vehicle electronic control device according to claim 1, wherein
 a plate having contact with the housing portion and forming a groove portion with a bottom is provided on the control board side of the housing portion, at a position corresponding to the exposure portion, and
 the interface sealing member is provided in the groove portion.

3. The vehicle electronic control device according to claim 2, wherein the plate is an adhesive tape.

4. The vehicle electronic control device according to claim 2, wherein the intermediate path portion of the terminal portion, at a part other than the exposure portion, is covered with a pre-mold resin formed by a resin separate from the housing portion.

5. The vehicle electronic control device according to claim 4, wherein an end of the pre-mold resin is exposed on the exposure portion side and forms a part of the groove portion.

6. The vehicle control device according to claim 4, wherein
 an exposure hole which allows the intermediate path portion to be exposed over an entire periphery thereof is formed in a part of the pre-mold resin, and
 the interface sealing member is provided in the exposure hole.

7. The vehicle electronic control device according to claim 1, wherein
 the housing portion has a seat face portion, and
 the terminal portion is formed such that the terminal is inserted substantially perpendicularly into the seat face portion and the intermediate path portion is bent to extend in a direction different from that of the terminal, and then extends out from the seat face portion side again.

8. The vehicle electronic control device according to claim 1, wherein
 a terminal group extending from the control board is joined with the terminal, a position of the joining being at an exterior of the housing portion,
 a depressed portion is provided around the position of the joining, and the exposure portion is provided near the depressed portion,
 a cover which covers the position of the joining is fitted to the depressed portion, and
 the interface sealing member is provided in the depressed portion and the exposure portion.

9. The vehicle electronic control device according to claim 1, wherein
 the housing portion has a seat face portion, and
 the terminal portion is formed such that the terminal is inserted substantially perpendicularly into the seat face portion and the intermediate path portion is bent to extend in a direction different from that of the terminal, and then extends out toward the control board side, to be connected to the control board.

10. The vehicle electronic control device according to claim 1, wherein the interface sealing member is potting resin.

11. A motor drive device comprising:
 an electric motor; and
 the vehicle electronic control device according to claim 1, integrally attached to an end in an axial direction of the electric motor.

12. A vehicle electronic control device comprising:
 a control board having an electronic component mounted thereon housed inside a case; and
 a connector portion for connecting the control board to an outside, wherein
 the connector portion is formed integrally with the case,
 the connector portion is formed by a housing portion covering the control board, and a terminal portion integrally embedded in the housing portion,
 the terminal portion includes a terminal for external connection, protruding from the housing portion, and an intermediate path portion extending from the terminal portion and connecting to the control board,
 an exposure portion which allows the intermediate path portion to be exposed over an entire periphery thereof is formed in a part of the housing portion,
 an interface sealing member for sealing an interface between the housing portion and the intermediate path portion is provided in the exposure portion,
 a plate having contact with the housing portion and forming a groove portion with a bottom is provided on the control board side of the housing portion, at a position corresponding to the exposure portion,
 the interface sealing member is provided in the groove portion,
 the intermediate path portion of the terminal portion, at a part other than the exposure portion, is covered with pre-mold resin formed by resin separate from the housing portion, and
 an end of the pre-mold resin is exposed on the exposure portion side and forms a part of the groove portion.

13. A vehicle electronic control device comprising:
 a control board having an electronic component mounted thereon housed inside a case; and
 a connector portion for connecting the control board to an outside, wherein
 the connector portion is formed integrally with the case,
 the connector portion is formed by a housing portion covering the control board, and a terminal portion integrally embedded in the housing portion,
 the terminal portion includes a terminal for external connection, protruding from the housing portion, and an intermediate path portion extending from the terminal portion and connecting to the control board,
 an exposure portion which allows the intermediate path portion to be exposed over an entire periphery thereof is formed in a part of the housing portion, and
 an interface sealing member for sealing an interface between the housing portion and the intermediate path portion is provided in the exposure portion,
 an interface sealing member for sealing an interface between the housing portion and the intermediate path portion is provided in the exposure portion, a plate having contact with the housing portion and forming a groove portion with a bottom is provided on the control board side of the housing portion, at a position corresponding to the exposure portion,
 the interface sealing member is provided in the groove portion,
 the intermediate path portion of the terminal portion, at a part other than the exposure portion, is covered with pre-mold resin formed by resin separate from the housing portion,
 an exposure hole which allows the intermediate path portion to be exposed over an entire periphery thereof is formed in a part of the pre-mold resin, and
 the interface sealing member is provided in the exposure hole.

14. The vehicle electronic control device according to claim 13, wherein the exposure hole is used as a pressing position for a mold for integrally molding the terminal portion and the housing portion.

15. The vehicle electronic control device according to claim 13, wherein
an end of the pre-mold resin protrudes on the exposure portion side and forms a part of the groove portion, and
the interface sealing member is provided at interfaces among three parts of the intermediate path portion, the pre-mold resin, and the housing portion.

16. The vehicle electronic control device according to claim 13, wherein
the exposure portion is formed, on an outer periphery of the pre-mold resin, at a position other than the exposure hole, and
the pre-mold resin is exposed over an entire periphery thereof at the exposure portion.

\* \* \* \* \*